United States Patent
Yamaguchi et al.

(10) Patent No.: US 8,916,794 B2
(45) Date of Patent: Dec. 23, 2014

(54) METAL JET APPARATUS AND JET METHOD

(75) Inventors: Katsumi Yamaguchi, Aichi (JP); Hiroshi Nakamura, Aichi (JP)

(73) Assignees: Japan Science and Technology Agency, Kawaguchi-shi (JP); Katsumi Yamaguchi, Aichi-gun (JP)

( * ) Notice: Subject to any disclaimer, the term of this patent is extended or adjusted under 35 U.S.C. 154(b) by 2323 days.

(21) Appl. No.: 10/551,356

(22) PCT Filed: Mar. 29, 2004

(86) PCT No.: PCT/JP2004/004399
§ 371 (c)(1),
(2), (4) Date: Aug. 2, 2006

(87) PCT Pub. No.: WO2004/087352
PCT Pub. Date: Oct. 14, 2004

(65) Prior Publication Data
US 2007/0063400 A1    Mar. 22, 2007

(30) Foreign Application Priority Data

Mar. 28, 2003   (JP) .................................. 2003-90946

(51) Int. Cl.
| | |
|---|---|
| B23K 10/00 | (2006.01) |
| B22F 9/08 | (2006.01) |
| C21C 5/46 | (2006.01) |
| H05K 3/34 | (2006.01) |

(52) U.S. Cl.
CPC .............. B22F 9/082 (2013.01); H05K 3/3468 (2013.01); *B22F 2009/088* (2013.01)
USPC .......................... 219/121.5; 239/79; 266/236

(58) Field of Classification Search
CPC .. B22F 9/082; B22F 2009/088; H05K 3/3468
USPC .......... 219/121.5, 76.17, 69.12; 239/79, 424, 239/390; 164/113, 437, 312; 425/7, 10, 425/225, 226; 266/99, 236
See application file for complete search history.

(56) References Cited

U.S. PATENT DOCUMENTS 3,840,623 A * 10/1974 Olsson et al. ................... 264/12

(Continued)

FOREIGN PATENT DOCUMENTS

| | | |
|---|---|---|
| EP | 0 852 976 | 7/1998 |
| JP | 59-118805 | 7/1984 |
| JP | 6-88202 | 3/1994 |

(Continued)

OTHER PUBLICATIONS

Office Action issued on Apr. 23, 2009 in corresponding Taiwanese patent application No. 093108549 with English translation.
Notice of Reasons for Rejection issued in corresponding Japanese Patent Application No. 2005-504218 on Sep. 8, 2009 with English translation.

*Primary Examiner* — Quang Van
(74) *Attorney, Agent, or Firm* — Kratz, Quintos & Hanson, LLP

(57) ABSTRACT

A metal jet apparatus comprises a discharge nozzle 31 for jetting molten metal 20, and a gas passage 33 for supplying inert gas to a peripheral portion of a discharge port 32 of the discharge nozzle 31. The discharge port 32 of the discharge nozzle 31 and an outlet of a gas passage 33 are provided with a nozzle cover 34. The nozzle cover 34 includes a space 35 which is in communication with the discharge port 32 and the outlet of the gas passage 33, and which opens downward. A ring-like projection 36 is disposed around the opening. When the molten metal 20 is jetted from the discharge port 32 into the space 35, the inert gas is supplied to the space 35, thereby preventing the molten metal 20 from being oxidized, and it is possible to prevent the nozzle of the discharge port 32 from being clogged, and to form the molten metal 20 into a spherical shape.

2 Claims, 2 Drawing Sheets

(56) References Cited

U.S. PATENT DOCUMENTS

| | | | |
|---|---|---|---|
| 5,289,975 A | 3/1994 | Miller et al. | 239/79 |
| 5,423,520 A * | 6/1995 | Anderson et al. | 266/99 |
| 2003/0051851 A1 * | 3/2003 | Yamada | 164/113 |

FOREIGN PATENT DOCUMENTS

| | | |
|---|---|---|
| JP | 10-244355 | 9/1998 |
| JP | 2001-293551 | 10/2001 |
| KE | 2001-293551 | 10/2001 |

* cited by examiner

METAL JET APPARATUS AND JET METHOD

TECHNICAL FIELD

The present invention relates to a metal jet apparatus and a jet method used for an apparatus which jets molten metal to bond a circuit or produces a three-dimensional structure.

BACKGROUND TECHNIQUE

In recent years, attempts have been made to produce various three-dimensional structures using prototyping technique utilizing computers. For example, patent document 1 described a configuration in which metal material is molten and Jetted from a nozzle, the nozzle or support means of a three-dimensional structure is moved in accordance with structure data of the three-dimensional structure to be produced, and a desired three-dimensional structure is produced.

(Patent Document 1)
Japanese Patent Application Laid-open No.H10-193079 (page 2, column 1, patent claim, page 3, column 4 (0007) to page 4 column 5 (0009), and FIGS. 1 to 3)

In a method using metal jet such as a prototyping technique, when molten metal is jetted into air from a nozzle, since the temperature of the molten metal is high, the molten metal reacts with oxygen in the air in the vicinity of an outlet of the nozzle and is oxidized, and they become a metal oxide such as ceramic. Since the metal oxide is accumulated in the vicinity of the outlet of the nozzle, the nozzle is clogged and the molten metal can not be jetted in many cases. If molten metal is oxidized immediately after It is discharged, molten metal droplets are not formed into spherical shape but are formed into shape having a tail. Therefore, the metal droplets are formed irregularly or a desired product can not be obtained in some cases.

Hence, it is an object of the present invention to prevent clogging of a nozzle hole which jets molten metal.

It is another object of the invention to form molten metal droplet into a spherical shape.

DISCLOSURE OF THE INVENTION

A first aspect of the present invention provides a metal jet apparatus comprising a discharge nozzle which jets the molten metal, inert gas supply means for supplying inert gas to a peripheral portion of nozzle hole, and a nozzle cover having a space in an outlet of the inert gas, which opens downward, wherein a projection is provided around the opening of the nozzle cover.

According to this aspect, metal droplets can be jetted from the nozzle hole into the space filled with the inert gas. Therefore, the molten metal jetted from the nozzle is not oxidized in the vicinity of the nozzle discharge port. Thus, it is possible to prevent nozzle hole from being clogged. Further, metal droplet can be formed into a spherical shape. The projection formed around the opening of the space can prevent air or oxygen from outside from entering the space.

According to a second aspect of the invention, in the metal jet apparatus of the first aspect, the apparatus further provides heating means for heating the discharge nozzle and the inert gas supply means.

According to the second aspect, heating the nozzle keeps the metal molten. Further, heating the inert gas exerts a buoyant in the inert gas in the space from which the metal is jetted, and this can prevent the inert gas from escaping.

A third aspect of the invention provides a metal jet apparatus comprising a discharge nozzle which melts metal and jets the molten metal, and gas supply means for supplying inert gas to a peripheral portion of a discharge port of the discharge nozzle According to this aspect, metal droplets can be jetted from the discharge nozzle into the space around the discharge port filled with the inert gas. Therefore, the molten metal jetted from the nozzle is not oxidized in the vicinity of the nozzle discharge port. Thus, it is possible to prevent the metal jet nozzle from being clogged. Further, the droplet of the molten metal jetted from the nozzle can be formed into a spherical shape.

A fourth aspect of the invention provides a metal jet apparatus comprising a discharge nozzle provided therein with molten metal, a discharge port for jetting the molten metal from one end of the discharge nozzle, and a pressing body for pressing the molten metal from the other end of the discharge nozzle in which the pressing body intermittently presses the molten metal in the discharge nozzle and jets the molten metal from the discharge port, wherein the discharge nozzle includes a curved surface shaped inner wall which forms a focal point at the discharge port or in the vicinity of the discharge port.

According to this aspect, the pressure applied to the molten metal can be concentrated on the discharge port of the discharge nozzle by the effect of the curved surface shaped inner wall which forms the focal point at the discharge port or a portion in the vicinity of the discharge port. Therefore, it is possible to generate high pressure portion in the vicinity of the focal point, and the dot-like molten metal can be jetted from the discharge port by the pressure.

A fifth aspect of the invention provides a metal jetting apparatus comprising a discharge nozzle provided therein with molten metal, a discharge port for letting the molten metal from one end of the discharge nozzle, and a pressing body for pressing the molten metal from the other end of the discharge nozzle in which the pressing body intermittently presses the molten metal in the discharge nozzle and jets the molten metal from the discharge port, wherein the pressing body includes a curved surface shaped inner wall which forms a focal point at the discharge port or in the vicinity of the discharge port.

According to this aspect, the pressure applied to the molten metal can be concentrated on the discharge port of the discharge nozzle by the effect of the curved surface shaped inner wall which forms the focal point at the discharge port or a portion in the vicinity of the discharge port. Therefore, it is possible to generate high pressure portion in the vicinity of the focal point, and the dot-like molten metal can be jetted from the discharge port by the pressure.

A sixth aspect of the invention provides a metal jet method comprising the steps of; jetting molten metal from a discharge nozzle in a form of droplet, and supplying inert gas to a peripheral portion of a discharge port of the discharge nozzle.

According to this aspect, metal droplets can be jetted from the discharge nozzle into the space filled with the inert gas. Therefore, the molten metal jetted from the nozzle is not oxidized in the vicinity of the nozzle discharge port. Thus, it is possible to prevent the metal jet nozzle from being clogged. Further, the droplets of the molten metal jetted from the nozzle can be formed into a spherical shape.

A seventh aspect of the invention provides an jet apparatus replacing the molten metal of the fourth or fifth aspect by a mixture of liquid and metal powder or non-metal powder, or liquid.

According to this aspect, the pressing force applied to the mixture or liquid can be concentrated on the discharge port of the discharge nozzle. Thus, it is possible to generate the high pressure portion in the vicinity of the focal point, and the dot-like mixture or liquid can be jetted from the discharge port by the pressure.

BEST MODE FOR CARRYING OUT THE INVENTION

Embodiments of the present invention will be explained below based on the drawings.
(First Embodiment)

Figure 1:
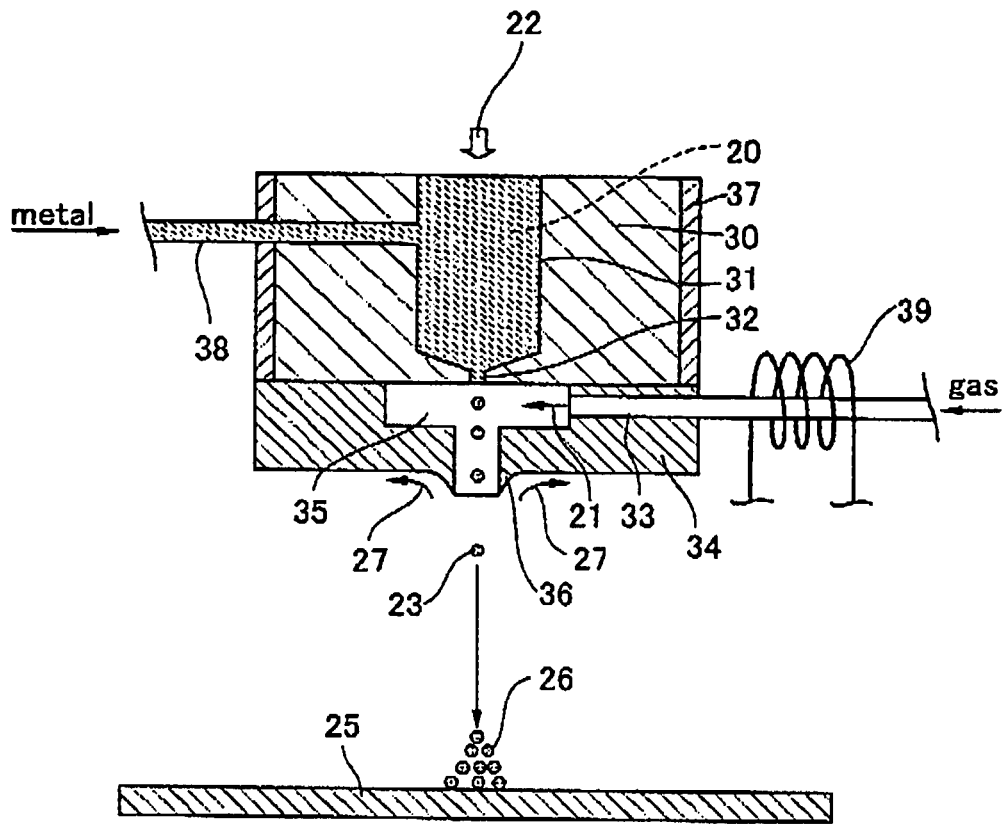
FIG. 1 is a partially sectional side view showing a configuration of a metal jet apparatus according to a first embodiment of the present invention.

FIG. 1 is a partially sectional side view showing a configuration of a metal jet apparatus according to a first embodiment of the present invention. In the metal jet apparatus of the embodiment, a discharge nozzle 31 and a discharge port 32 are disposed. The discharge nozzle 31 includes molten metal 20 therein. The molten metal 20 is jetted from a center of a nozzle body 30. The discharge port 32 discharges dots. A gas passage 33 supplies inert gas 21. The gas passage 33 is provided at its Intermediate portion with a heater 39 as heating means. A tip end of the discharge port 32 of the discharge nozzle 31 and a tip end of the gas passage 33 as inert gas supply means are provided with a nozzle cover 34 having a space 35. The molten metal 20 and the inert gas 21 pass through the space 35. In other words, the nozzle cover 34 includes the space 35 which is in communication with outlets of the discharge port 32 and the gas passage 33 and which opens downward. A ring-like projection 36 is formed around a lower portion of the opening of the space 35 of the nozzle cover 34. A heater 37 as heating means for heating the discharge nozzle 31 is provided inside or outside of the nozzle body 30.

A metal supply passage 38 is in communication with the discharge nozzle 31. The molten metal 20 is supplied into the discharge nozzle 31 from outside through the metal supply passage 38. The inert gas 21 such as nitrogen gas and helium gas which do not react with the molten metal 20 is supplied into the gas passage 33 from outside.

A support member 25 for supporting a product 26 to be produced is disposed at a location opposed to the discharge port 32. The discharge port 32 and the support member 25 can move relatively with respect to each other. A moving mechanism and a moving method of the discharge port 32 and the support member 25 may be the same as those described in patent document 1, and explanation thereof will be omitted.

The gas passage 33 may be a groove formed between the nozzle body 30 and the nozzle cover 34. That is, a surface of one of the nozzle body 30 and the nozzle cover 34 may be provided a spiral groove or a meandering groove as the gas passage 33. Although the heater 37 and the heater 39 are provided as the heating means, the heater 37 may heat the gas passage 33.

Next, the operation will be explained. The molten metal 20 to be discharged through the metal supply passage 38 is supplied to the discharge nozzle 31 in the nozzle body 30. As the molten metal 20, a metal material constituting the product 26 to be produced is used. For example, solder, silver, lead-free solder such as tin alloy, white metal alloy having low melting point, aluminum and the like are arbitrarily selected. The kinds of the metals are appropriately changed and used in accordance with the configuration of the product 26. The molten metal 20 is supplied in its molten state, and the discharge nozzle 31 is filled with the molten metal 20. At that time, the molten metal 20 can be kept in molten state by heating the discharge nozzle 31 by means of the heater 37.

The inert gas 21 which does not react with the molten metal 20 is supplied to the gas passage 33. The supply amount of the inert gas 21 is set to such a small amount that the space 35 of the nozzle cover 34 is filled with the inert gas 21 and the inert gas 21 slightly flows out from the nozzle cover. Since the gas supply passage 33 of the inert gas 21 is also heated by the heater 39, the inert gas 21 which fills the space 35 is also kept heated. Therefore, the inert gas 21 in the space 35 stays in the space 35 by a buoyant force, and the amount of inert gas 21 which leaks out from the nozzle cover 34 is very small. The ring-like projection 36 is formed around the outlet of the space 35 which is a tip end of the nozzle cover 34. This projection 36 prevents outside air 27 such as air and oxygen from entering into the space 35 of the nozzle cover 34 from outside of the nozzle cover 34. Thus, although the space 35 is in contact with the outside air 27, it is possible to maintain the state in which the space 35 is filled with the inert gas 21.

In this state, if a discharge signal 22 is sent to the molten metal 20 in the discharge nozzle 31, the molten metal 20 is discharged from the discharge port 32 into the space 35 as droplets 23 in response to the discharge signal 22. The discharge signal 22 can be sent by a method appropriate selected in accordance with kinds of the molten metal such as an electric discharge method described in patent document 1, a method using a piezoeleotric element, and a method using laser irradiation.

Since the space 35 is filled with the inert gas 21 as described above, each of the metal droplets 23 is brought into a spherical shape momentarily without being oxidized. The spherical droplets 23 are Jetted outside from the space 35 of the nozzle cover 34 by power caused by the discharge signal 22 and are deposited on the support member 25 in succession and the product 26 are formed. The producing method of the three-dimensional structure of the product 26 is the same as the method described in patent document 1.

According to the metal jet apparatus of the first embodiment, if the space 35 is filled with the inert gas 21, the surface of the molten metal at the discharge port 32 is not oxidized after the droplet 23 is discharged. Therefore, metal oxide is not accumulated in the vicinity of the discharge port 32 and the discharge port 32 is not clogged with metal oxide. Further, the molten metal jetted from the discharge port 32 can be brought into the spherical shape (precise spherical shape).
(Second Embodiment)

Figure 2:
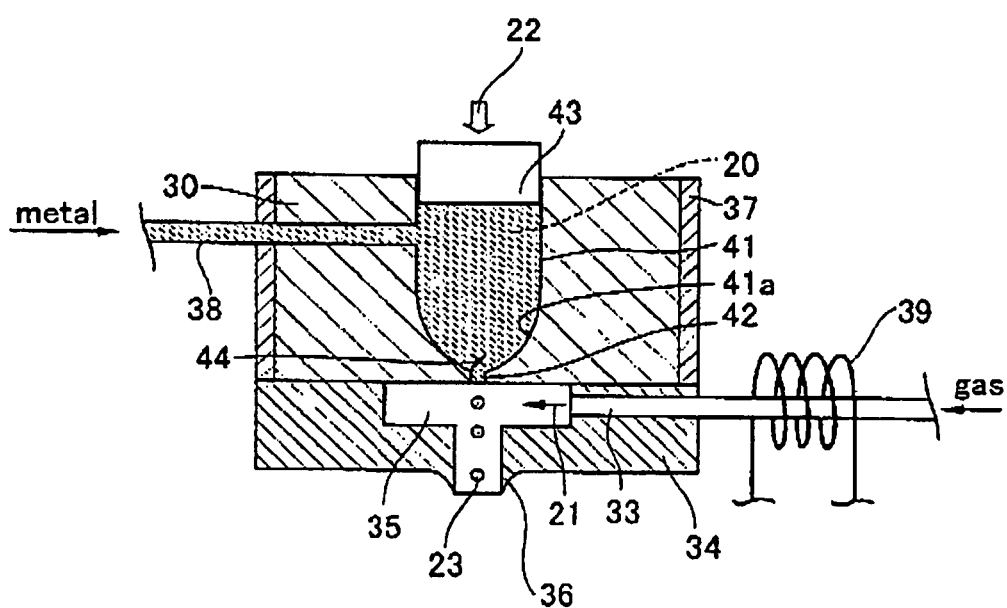
FIG. 2 is a conception diagram showing a configuration of a metal jet apparatus according to a second embodiment of the invention.

FIG. 2 is a conception diagram showing a configuration of a metal jet apparatus according to a second embodiment of the invention. In the metal jet apparatus of the second embodiment, configurations of the following elements are different from those of the first embodiment, i.e., a discharge port 42 provided one of ends of a discharge nozzle 41, an inner wall 41a of the discharge nozzle 41 located on the side of the discharge port 42, and a pressing body 43 which is located on the other end of the discharge nozzle 41 and which presses the molten metal 20. Other configuration of the second embodiment is the same as that of the first embodiment. The discharge nozzle 41 is of a cylindrical shape, and is provided therein a cylindrical pressing body 43 at its upper portion. The inner wall 41a is on the side of the discharge port 42 of the discharge nozzle 41 and is in contact with the molten metal 20. The inner wall 41a is formed into a curved surface shape. The discharge nozzle 41 has the discharge port 42 from which the molten metal 20 is jetted. The discharge port 42 is disposed in the vicinity of a focal point 44 of the curved surface of the inner wall 41a (the curved surface of the inner wall 41a forms the focal point 44).

In other words, the discharge nozzle 41 has the curved surface shaped inner wall 41a forming the focal point 44 at the center of the discharge port 42 or in the vicinity of the center of the discharge port 42. An example of the curved surface shaped inner wall 41a is a parabolic shape comprising a parabola curved surface in which the focal point distance is short and the focal point 44 can easily be located at the discharge port 42. The molten metal 20 is jetted from the discharge port 42. The pressing body 43 is means for pressing the molten metal 20 from behind. The pressing body 43 comprises a piezoelectric element, and is moved in a pulse manner by the discharge signal 22 for example.

Next, the operation will be explained. If the pressing body 43 presses the molten metal 20 intermittently, the pressure wave applied to the molten metal 20 by the effect of the inner wall 41a having the parabolic shape can be concentrated on the focal point 44, i.e., on the discharge port 42 in the vicinity of the focal point 44. As a result, dot-like molten metal 20 can be jetted from the discharge port 42 by the high pressure portion generated in the vicinity of the focal point 44. Other operation and effect are the same as those of the first embodiment and thus, explanation thereof will be omitted.

According to the metal jet apparatus of the second embodiment, as described above, the droplets 23 of the molten metal 20 can be jetted into the space 35 from the discharge port 42 in the state in which the space 35 is filled with the inert gas. Therefore, like the first embodiment, the molten metal 20 jetted from the discharge port 42 is not oxidized in the vicinity of the discharge port 42. Thus, it is possible to prevent the nozzle of the discharge port 42 from being clogged. Since the droplets 23 are jetted in the form of dot, the molten metal 20 can be formed into the spherical shape.

(Third Embodiment)

Figure 3:
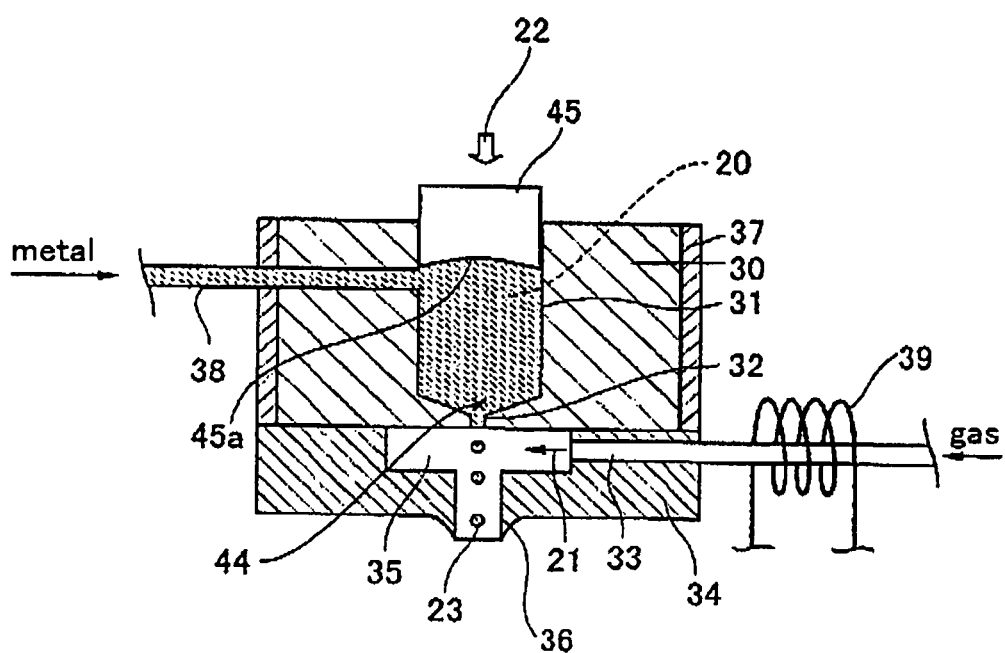
FIG. 3 is a conception diagram showing a configuration of a metal jet apparatus according to a third embodiment of the invention.

FIG. 3 is a conception diagram showing a configuration of a metal jet apparatus according to a third embodiment of the invention. In the metal jet apparatus of the second embodiment, configurations of the following elements are different from those of the second embodiment, i.e., the discharge nozzle 31, the discharge port 32 in one of ends of the discharge nozzle 31, and a pressing body 45 which is provided on the other end of the discharge nozzle 31 and which presses the molten metal 20. Other configuration of the second embodiment is the same as that of the second embodiment. The discharge nozzle 31 is of a cylindrical shape, and is provided therein with the cylindrical pressing body 45 at its upper portion. The molten metal 20 is jetted from the discharge port 32. The pressing body 45 presses the molten metal 20 from behind to increase its pressure. The pressing body 45 comprises a piezoelectric element for example, and is moved in a pulse manner by the discharge signal 22. A pressing body end surface 45a of the pressing body 45 is in contact with the molten metal 20. The pressing body end surface 45a is formed into a curved surface shape. The pressing body end surface 45a is formed into a concave shape in which the focal point distance is long and the focal point 44 can easily be located at the discharge port. The discharge nozzle 31 has the discharge port 32 from which the molten metal 20 is jetted. The discharge port 32 is disposed in the vicinity of the focal point 44 of the curved surface of the pressing body 45a. In other words, the pressing body 45 has the pressing body end surface 45a of the curved surface shape forming the focal point 44 at or in the vicinity of the center of the discharge port 32 of the discharge nozzle 31.

Next, the operation will be explained. If the molten metal 20 is intermittently pressed from behind by the pressing body 45, the pressure applied to the molten metal 20 can be concentrated on the focal point 44 by the effect of the pressing body end surface 45a having the concave shape. As a result, dot-like molten metal 20 can be jetted under high pressure momentarily from the discharge port 32 of the discharge nozzle 31 in the vicinity of the focal point 44. Other operation and effect are the same as those of the first and second embodiments and thus, explanation thereof will be omitted.

According to the metal jet apparatus of the third embodiment, as described above, the droplets 23 of the molten metal 20 can be jetted into the space 35 from the discharge port 32 in the state in which the space 35 is filled with the inert gas. Therefore, like the second embodiment, the molten metal 20 jetted from the discharge port 32 is not oxidized. Thus, it is possible to prevent the nozzle of the discharge port 32 from being clogged. Since the droplets 23 are jetted in the form of dot, the molten metal 20 can be formed into the spherical shape.

In the embodiments above mentioned, each of the inner wall 41a of the discharge nozzle 41 and the pressing body end surface 45a is of the curved surface shape comprising parabolic shape. The parabolic shape is not necessarily needed, if the combination of the inner wall 41a and the pressing body end surface 45a forms a focal point at the discharge port 32, 42 or in the vicinity of the discharge port 32, 42.

In the second and third embodiments, the metal jet apparatus jets the molten metal, but the present invention is not limited to the molten metal. Even if the molten metal is replaced by mixture of liquid and metal powder or non-metal powder, or liquid having such a viscosity that the liquid does not naturally fall from the discharge port 32, 42 by gravity, the same effect can be obtained. When the mixture of liquid and metal powder or non-metal powder, or liquid is used, since it is not oxidized, it is unnecessary to supply inert gas or to fill the space 35 with inert gas.

According to the metal jet apparatus and the jetting method of the present invention, only the tip end of the nozzle is filled with inert gas with the simple method, and the metal droplets can be jetted from the discharge nozzle. Therefore, the molten metal jetted from the nozzle is not oxidized. Thus, it is possible to prevent the nozzle of the metal jet nozzle from being clogged. Further, the droplets of molten metal jetted from the nozzle can be formed into the spherical shape. Furthermore, air or oxygen from outside can be prevented from entering into the space by the projection formed around the opening of the space.

According to the metal jet apparatus of the invention, the pressure applied to the molten metal can be concentrated on the discharge port of the discharge nozzle by the effect of the curved surface shaped inner wall which forms the focal point at a portion in the vicinity of the discharge port. Therefore, it is possible to generate high pressure portion in the vicinity of the focal point, and the dot-like molten metal can be jetted from the discharge port by the pressure.

Industrial Applicability

The present invention can be utilized for an apparatus which jets molten metal to bond a circuit or produces a three-dimensional structure.

The invention claimed is:

1. A metal jet apparatus for jetting spherical molten metal droplets, the metal jet apparatus comprising:
   a discharge nozzle provided therein with molten metal,
   a discharge port for jetting said molten metal from one end of said discharge nozzle, and
   a pressing body for pressing said molten metal from the other end of said discharge nozzle in which said pressing body intermittently presses said molten metal in said discharge nozzle and jets said molten metal from said discharge port,
   wherein said discharge nozzle includes a curved surface shaped inner wall which forms a focal point at said discharge port or in the vicinity of said discharge port, and
   said molten metal jetted from said discharge port is spherical molten metal droplets.

2. A jet apparatus according to the metal jet apparatus in claim 1, wherein said molten metal is replaced by a mixture of liquid and metal powder or non-metal powder, or liquid.

* * * * *